(12) United States Patent
Strane et al.

(10) Patent No.: US 6,809,027 B2
(45) Date of Patent: Oct. 26, 2004

(54) SELF-ALIGNED BORDERLESS CONTACTS

(75) Inventors: Jay W. Strane, Chester, NY (US); Hiroyuki Akatsu, Yorktown Heights, NY (US); David M. Dobuzinsky, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 10/165,264

(22) Filed: Jun. 6, 2002

(65) Prior Publication Data

US 2003/0228752 A1 Dec. 11, 2003

(51) Int. Cl.[7] .......................................... H01L 21/4763
(52) U.S. Cl. ...................................... 438/637; 438/243
(58) Field of Search .................................. 438/587, 621

(56) References Cited

U.S. PATENT DOCUMENTS

| | | | | |
|---|---|---|---|---|
| 6,130,449 A | * | 10/2000 | Matsuoka et al. | 257/296 |
| 6,168,986 B1 | * | 1/2001 | Walker et al. | 438/243 |
| 6,245,651 B1 | * | 6/2001 | Divakaruni et al. | 438/587 |
| 6,380,063 B1 | * | 4/2002 | Chediak et al. | 438/621 |
| 6,534,389 B1 | * | 3/2003 | Ference et al. | 438/586 |
| 6,544,850 B1 | * | 4/2003 | Schnabel et al. | 438/286 |

* cited by examiner

*Primary Examiner*—David Nelms
*Assistant Examiner*—Thao P. Le
(74) *Attorney, Agent, or Firm*—Todd M. C. Li

(57) ABSTRACT

A method for forming high-density self-aligned contacts and interconnect structures in a semiconductor device. A dielectric layer thick enough to contain both interconnect and contact structures is formed on a substrate. A patterned hardmask is formed on the dielectric layer to define both the interconnect and contact structures. The openings for interconnect features are first formed by partially etching the dielectric layer selective to the hardmask. A second mask (e.g., a resist) is used to define the contact openings, and the dielectric layer is etched through the second mask, also selective to the hardmask, to expose the diffusion regions to be contacted. The patterned hardmask is used to help define the contact openings. Conductive material is then deposited in the openings which results in contacts and interconnects that are self-aligned. By first forming the openings for both interconnect and contacts, savings in processing steps may be obtained.

6 Claims, 18 Drawing Sheets

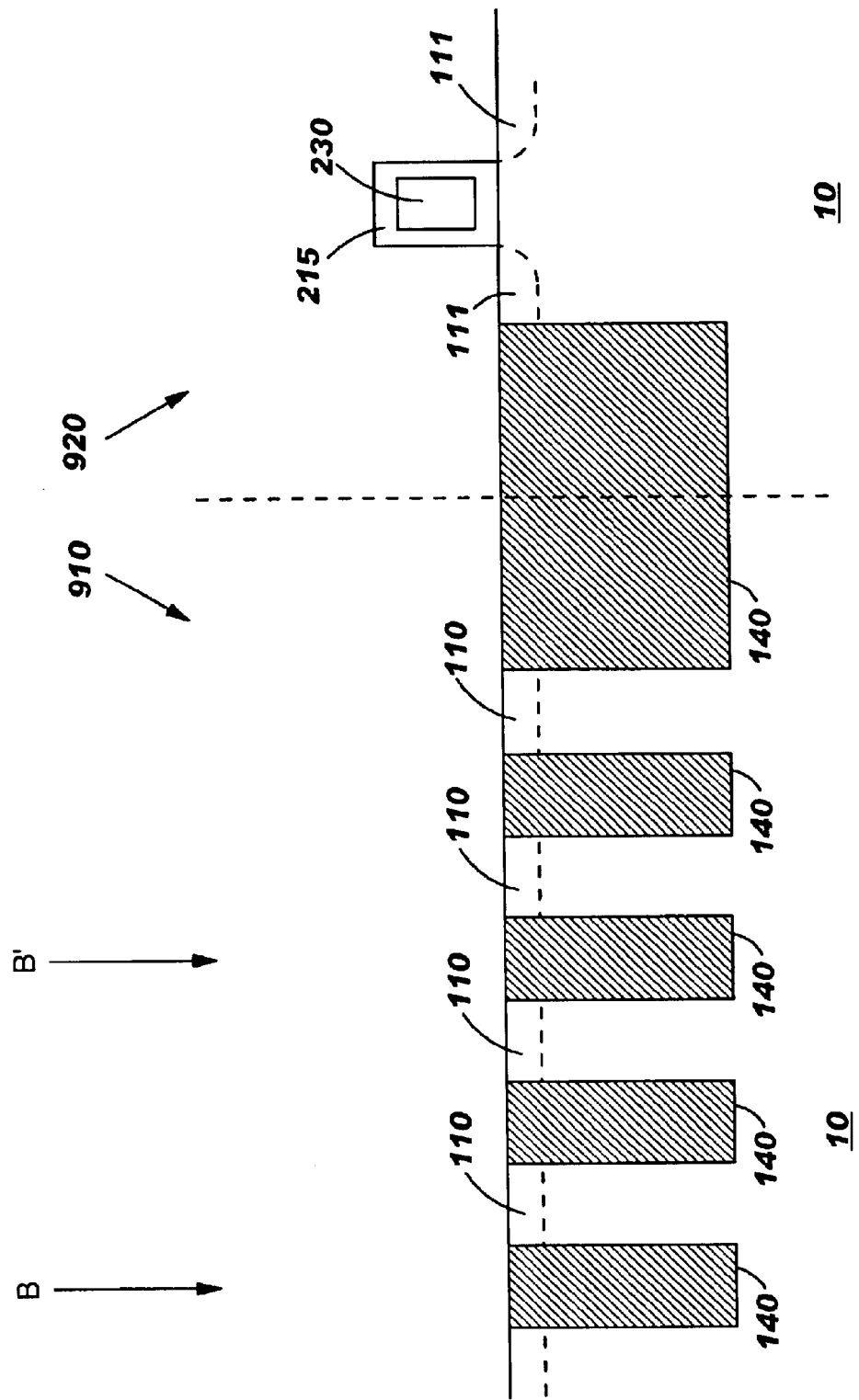

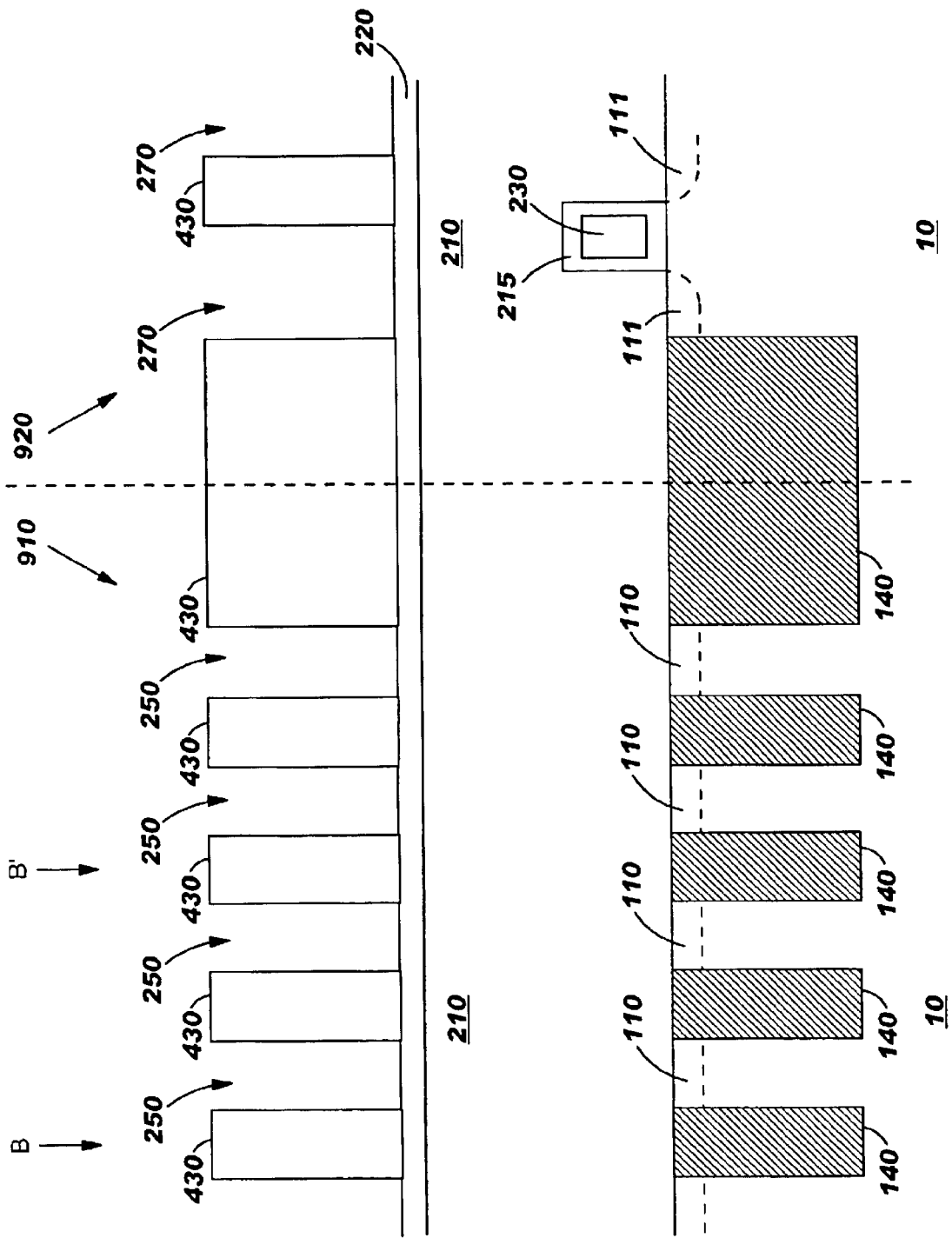

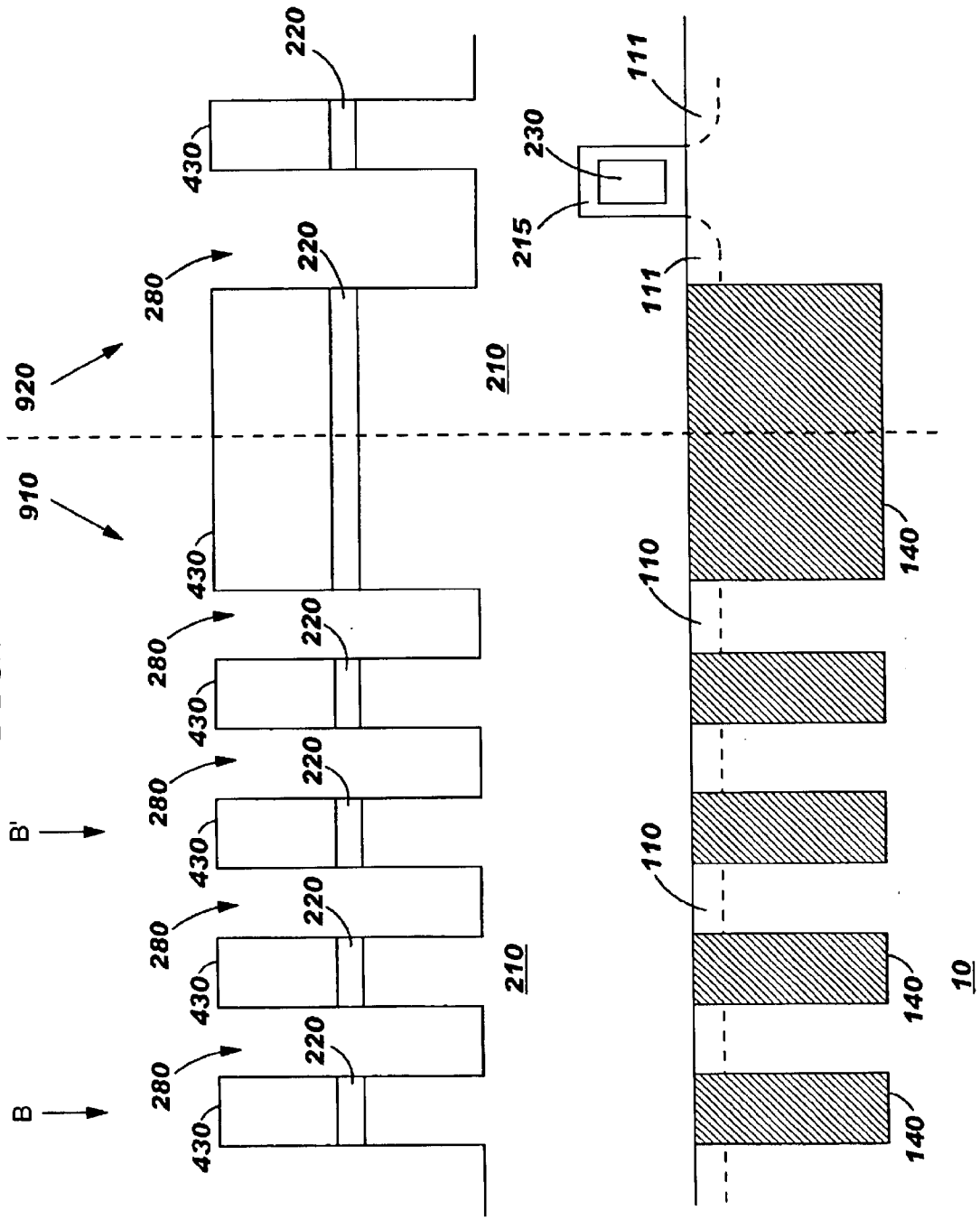

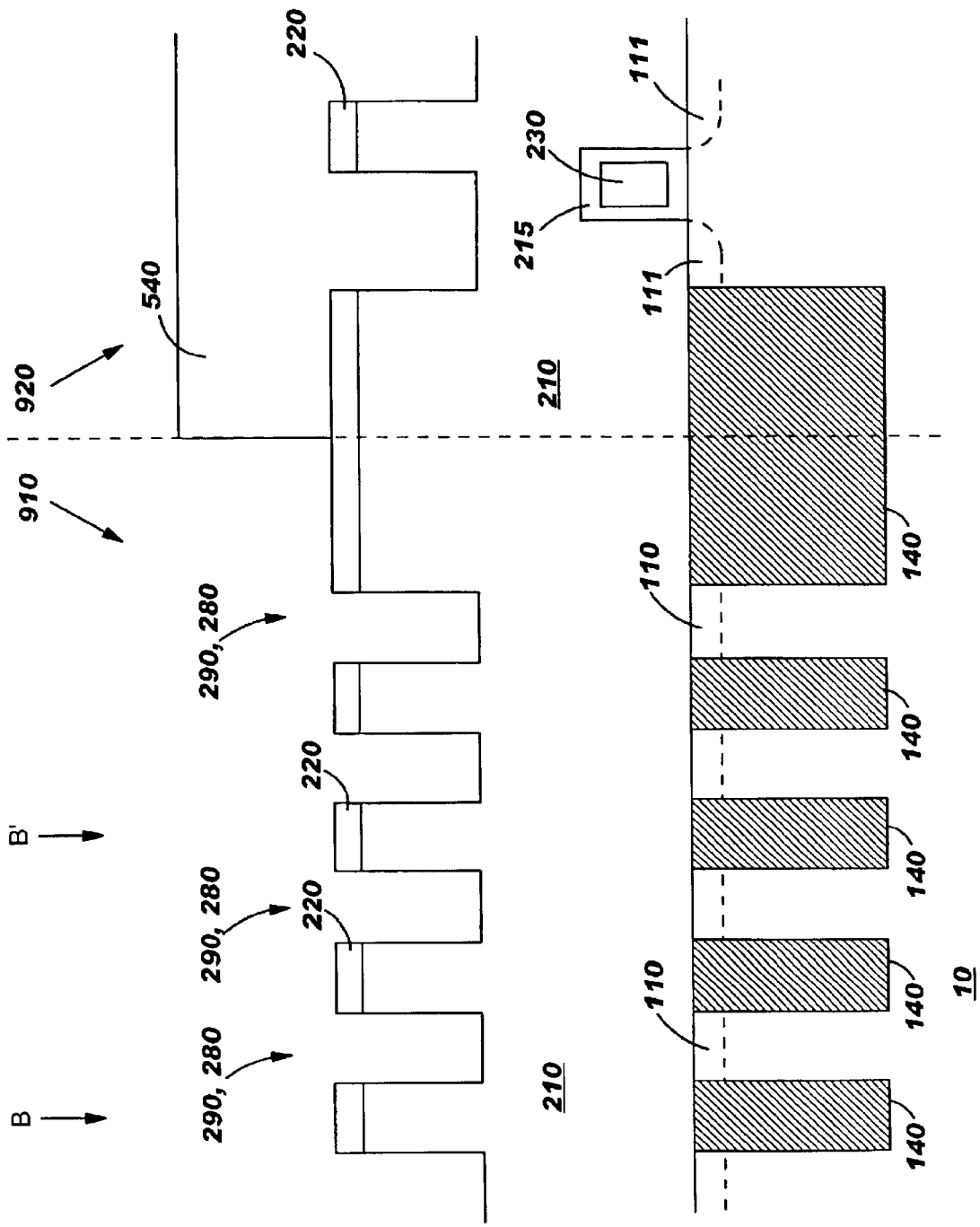

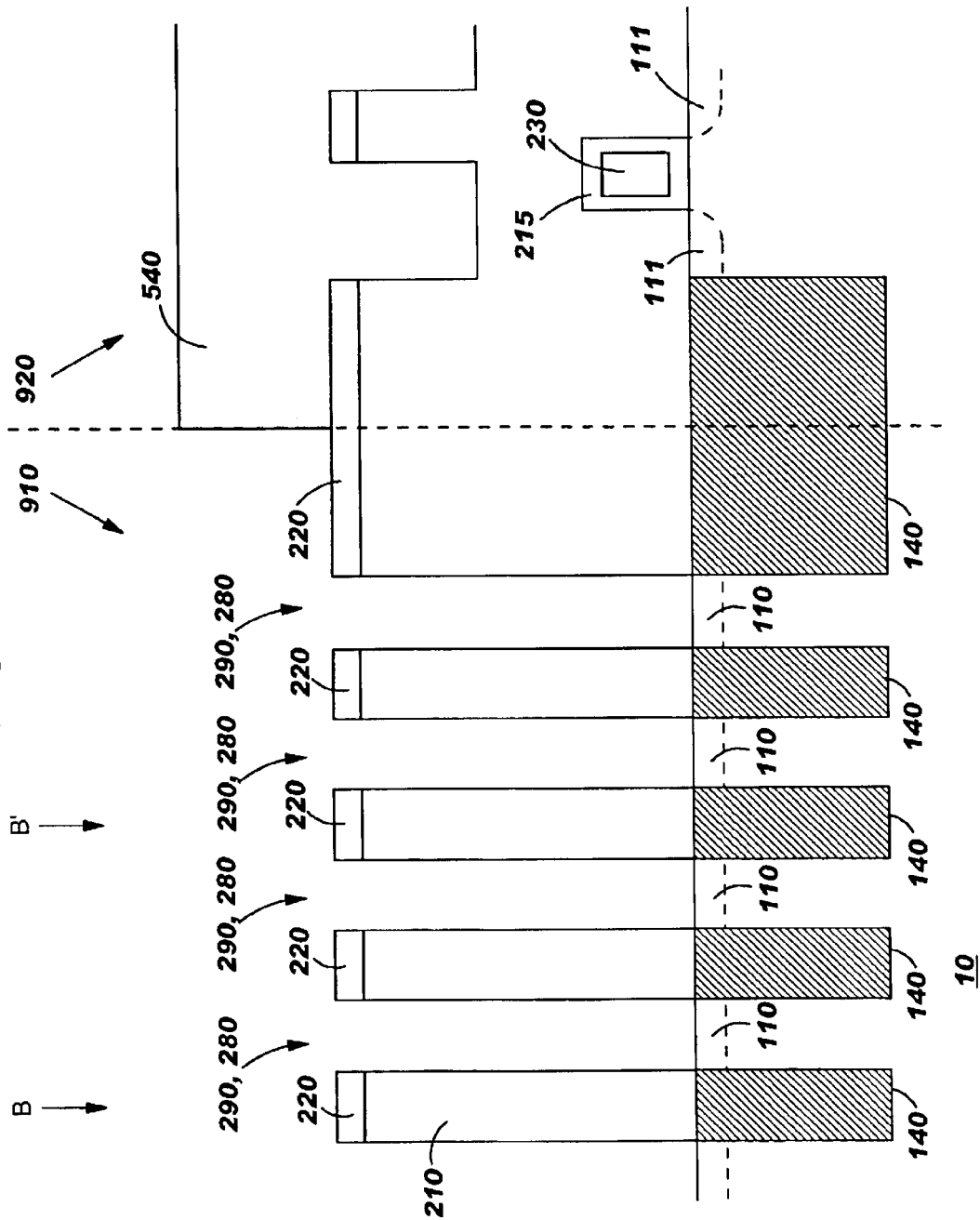

FIG. 9B (Prior Art)
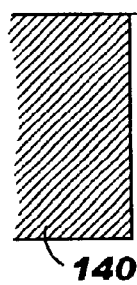
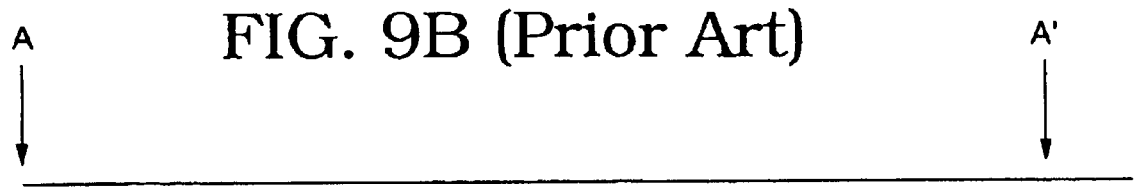
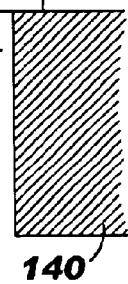
FIG. 9C (Prior Art)

SELF-ALIGNED BORDERLESS CONTACTS

FIELD OF THE INVENTION

The present invention relates to the manufacture of semiconductors and more specifically relates to the manufacture of dynamic random access memory (DRAM) arrays.

BACKGROUND OF THE INVENTION

The integration of semiconductor devices for very large semiconductor integration (VLSI) requires that the devices first be fabricated so that they are electrically isolated from each other. Ultimately, these devices must be electrically interconnected to provide the desired circuit functionality. Thus, interconnection structures (e.g. wiring, word lines (WLs), bit lines (BLs), etc.) and contact structures, between the interconnection structures and the semiconductor devices, must also be formed.

Semiconductor memory chips, such as dynamic random access memory (DRAM), typically include array regions, including arrays of memory cells, as well as support regions, which include logic devices that provide support functionality. As dimensions shrink to 110 nm and below, DRAM technologies face several critical challenges. The cell design must be "friendly" for lithography and for the use of self-alignment techniques in the array. For example, misalignment of interconnection and contact structures can result in problems such as leakage or shorts, and increased resistance, affecting both functionality and performance.

Conventional methods of forming contacts and interconnection structures involve multiple processing steps, including lithographic masks for contacts and interconnection features at the minimum lithographic dimensions (i.e. minimum feature size). Processes involving masks having minimum feature sizes are relatively costly, and the difficulty of achieving overlay of such features without misalignment between different processing levels increases.

An example of a conventional wiring and contact layout in an array region is illustrated in the plan view shown in FIG. 8A, where source/drain diffusion regions (active areas AA) 110 on a substrate are oriented along vertical lines, and word lines 130 are formed over the substrate, running horizontally across the diffusion regions 110. Wiring lines 120 (such as bit lines) might be laid out to run parallel and overlaying the diffusion regions 110. Although it is preferable for the wiring lines 120 to be aligned over the diffusion regions 110, typically there will be some misalignment, as illustrated in FIG. 8A. Note that the illustrations are not intended to be drawn to scale, and the misalignments shown are exaggerated for illustration purposes. Contact via holes 150 may be laid out to define contact structures for connecting the wiring to diffusion regions of devices (not shown) that are formed in the substrate.

Referring to the cross-section views along lines A–A' in FIG. 8B and along line B–B' in FIG. 8C, the contact structures 150 and wiring structures 120 formed by conventional processes are illustrated. Typically, contact structures 150 are formed in a dielectric layer 210 formed over the devices in the substrate 10, for example, by a damascene process. Following that, wiring structures 120 may be formed within another dielectric layer 211, again using methods known in the art, such as a damascene method. However, this sequential method of first forming the contact structures and then forming the wiring structures suffers from two disadvantages. First, there may be overlay misalignments that can result in potential functional problems and require design tolerances that tend to limit the minimum size of devices and thereby limiting densities. Such design tolerances contribute to process costs. In addition, each additional step in the processing adds significant costs.

Many different layouts for array regions may be formed, depending on the device type and other factors. For example, for some layouts, line-type contact structures may be appropriate, such as illustrated in FIG. 9A, in which the wiring lines 120 and the contact regions 150 are both arranged in a linear fashion overlaying the linear diffusion region 110. Once again, misalignment may occur, as shown in FIG. 9A and the associated cross-sections along lines A–A' and B–B' in FIGS. 9B and 9C, respectively.

Divakaruni et al. (U.S. Pat. No. 6,245,651) proposed a method for creating self-aligned borderless contacts in which a first dielectric layer is formed in both the array and support regions, and then an etch stop layer is formed over the support region. The array regions include gate stacks in the first dielectric layer, and diffusion regions between the gate stacks in the substrate, to which bitline contacts are to be formed. A second dielectric layer is then deposited over the array region and the support region, which includes the etch stop layer in the support region. The second dielectric layer is patterned to define the interconnect structures. Etching of the second dielectric layer is performed to form the interconnect structures in both the array and support regions. The etch stop layer in between the first and second dielectric layers stops the etching in the support region, but allows further etching in the array region to form the contacts, which are borderless to the gate stacks and provide contact to the diffusion regions. Subsequently, the contacts and interconnect structures may be filled with a conductive material, for example, using a damascene process. However, the method of Divakaruni et al. has the disadvantage that the buried etch stop layer in the support region produces topographical anomalies that makes removal of excess conductive material difficult in the planarization step of the damascene process. In addition, the use of separate dielectric and etch stop layers in the method of Divakaruni et al. adds complexity to the processing, and tends to increase costs.

In view of the foregoing discussion, there is a need for a process for fabricating contact and interconnect structures in high-density regions of a semiconductor chip (such as in a memory array) to reduce the misalignment of contacts and interconnection structures. In addition, there is a need to reduce the cost of such processes by reducing the number of steps in the process and/or reduce the complexity and cost of masks used in such processing.

SUMMARY OF THE INVENTION

The present invention addresses the above-described need by providing a method for forming high-density self-aligned contacts and interconnect structures in a semiconductor device. A dielectric layer thick enough to contain both interconnect and contact structures is formed on a substrate. A patterned hardmask is formed on the dielectric layer to define both the interconnect and contact structures. The openings for interconnect features are first formed by partially etching the dielectric layer selective to the hardmask. A second mask (e.g., a resist) is used to define the contact openings, and the dielectric layer is etched through the second mask, also selective to the hardmask, to expose the diffusion regions to be contacted. The patterned hardmask is used to help define the contact openings. Conductive material is then deposited in the openings which results in contacts and interconnects that are self-aligned. By first forming the openings for both interconnect and contacts, savings in processing steps may be obtained.

In accordance with the present invention, a method for forming a semiconductor device comprising the steps:

providing a substrate including a support region and an array region having an array device diffusion region;

depositing a dielectric layer on said substrate;

forming a patterned hardmask on said dielectric layer, said patterned hardmask having a first opening that overlays at least a portion of said array device diffusion region;

partially etching said dielectric layer selective to said hardmask through said first opening to form a first recess in said dielectric layer;

forming a second mask having a second opening at least partially overlapping a portion of said first recess; and subsequently etching said dielectric layer selective to said hardmask through said second opening and through said portion of said first recess, so that said portion of said first recess is extended through said dielectric layer to form a second recess so that a corresponding portion of said array device diffusion region is exposed.

In accordance with another aspect of the present invention, the interconnect structures of the support region may be formed at the same time as the interconnect structures in the array region.

In accordance with another aspect of the present invention, after formation of the interconnect structures, the support region may be protected, for example, by a block mask, during the formation of the contact features in the array region. Subsequently, the contact features in the support region may be formed separately.

In accordance with the present invention, a semiconductor device is provided having a substrate including a device diffusion region;

a dielectric layer on said substrate;

a contact structure formed in said dielectric layer;

an interconnect structure formed in said dielectric layer over said contact structure, so that said contact structure is in contact with said device diffusion region and in contact with said interconnect structure and wherein said contact structure and said interconnect structure are aligned with each other.

In yet another aspect according to the present invention, the semiconductor device includes an array region and a source region. For example, the array region may be an array of memory cells, such as dynamic random access memory (DRAM) cells. In another aspect, the devices in the array region may be vertical devices, or may be planar devices.

In yet another aspect according to the present invention, the device diffusion region is associated and corresponds to a gate stack having an encapsulating material (e.g., a dielectric), where the device diffusion region is adjacent to the encapsulating material so that the contact structure is borderless to the encapsulating material of the gate stack.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

BRIEF DESCRIPTION OF THE DRAWINGS

FIGS. 2A–2C illustrates cross-sectional views of a semiconductor substrate at a processing stage of one embodiment in accordance with the present invention.

FIGS. 3A–3C illustrates cross-sectional views of a semiconductor substrate at a subsequent processing stage of one embodiment in accordance with the present invention.

FIGS. 4A–4C illustrates cross-sectional views of a semiconductor substrate at a subsequent processing stage of one embodiment in accordance with the present invention.

FIGS. 5A–5C illustrates cross-sectional views of a semiconductor substrate at a subsequent processing stage of one embodiment in accordance with the present invention.

FIGS. 6A–6C illustrates cross-sectional views of a semiconductor substrate at a subsequent processing stage of one embodiment in accordance with the present invention.

FIGS. 9B–9C illustrates cross-sectional views of the layout of FIG. 9A.

DESCRIPTION OF THE PREFERRED EMBODIMENTS

In the following descriptions of the preferred embodiments of the invention, a method is described for forming contacts that are self-aligned to interconnect structures and reduces processing costs. Reference is made to the drawings to illustrate the method according to the present invention, which are not necessarily drawn to scale.

Figure 1A:
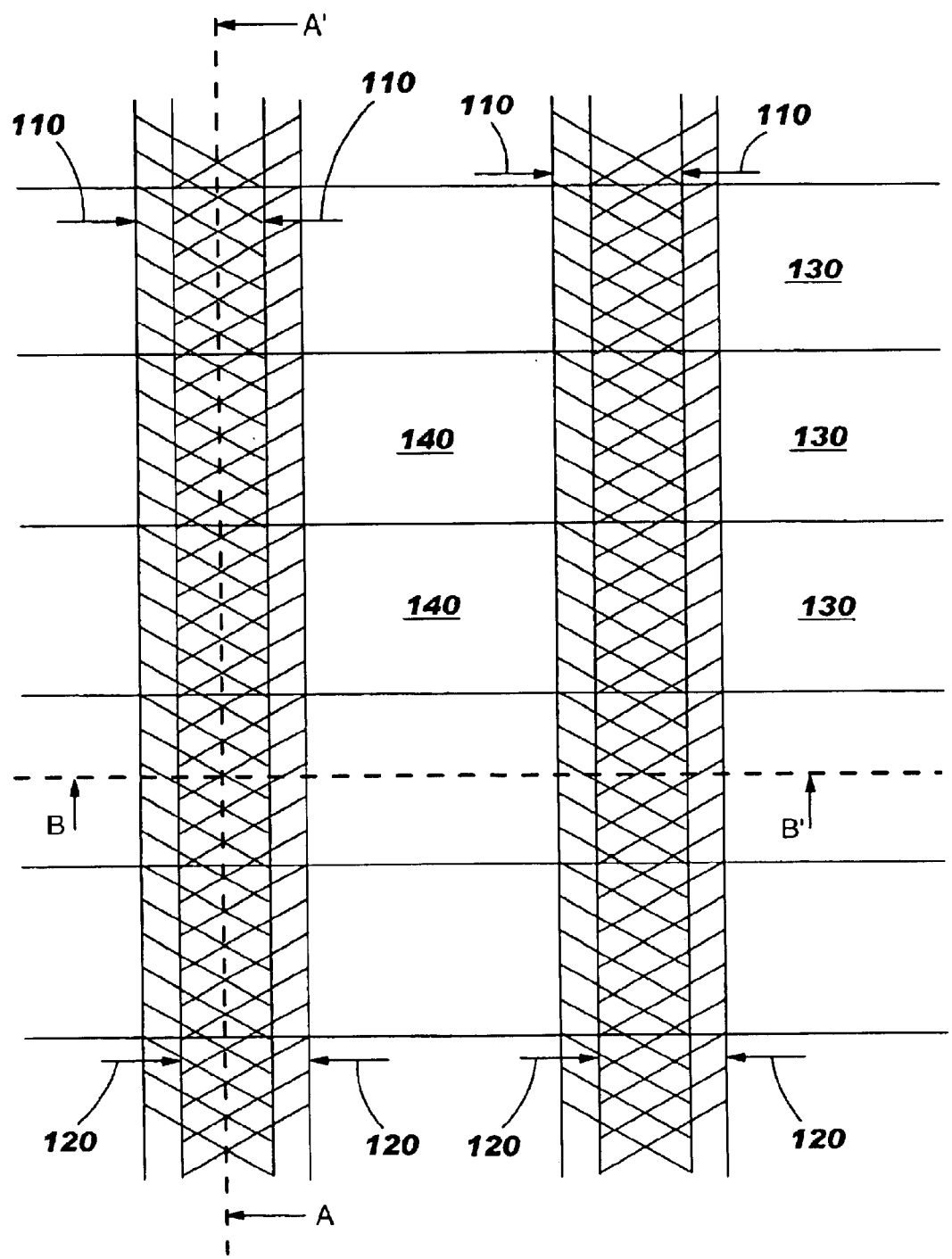
FIG. 1A illustrates a plan view of an array region layout.
Figure 2B:
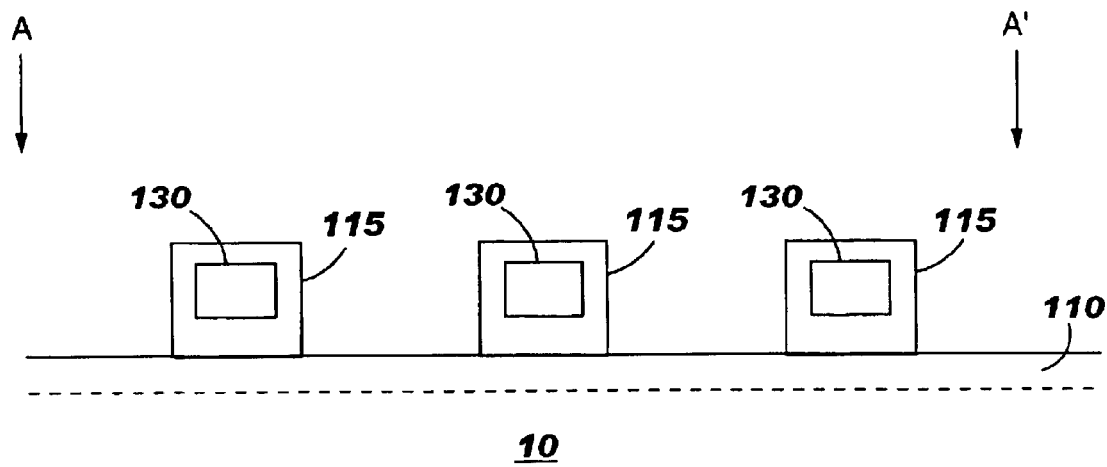

Referring to FIG. 1A, a plan view of a layout in a memory array region (for example, a DRAM memory array) on a substrate of a semiconductor chip. Source/drain regions 110 in the substrate (which are typically doped regions, also known as active area, or AA regions 110) are laid out in this embodiment in linear fashion, for example, by using a line-type mask. Memory cells (not shown) are formed along the AA regions 110 at or near the intersection of the AA regions 110 and the word lines 130. Note that in some embodiments, the word lines 130 may function as gate conductors at the intersection with the diffusion regions 110. Thus, in accordance with the present invention, gates stacks 130 that are encapsulated in a dielectric 115, for example, as illustrated in FIG. 2B, are associated with the source/drain diffusion regions 110, and referred to hereinafter interchangeably with word lines 130. The word lines 130 may be laid out essentially orthogonally to the orientation of the diffusion regions 110, but could also be laid out to cross the AA patterns 110 (which are lines in this example, but could take arbitrary paths in other embodiments) at other angles. Isolation regions 140 are formed in the substrate between the diffusion regions 110. Wiring lines (such as bitlines) 120 are typically formed over the devices formed in and on the substrate. The wiring lines 120 are preferably laid out to be aligned with the diffusion regions 110, but typically there is some overlay misalignment between the wiring lines 120 and the AA or diffusion lines 110, as illustrated in FIG. 1A. The present invention provides a method for forming contacts between the wiring lines 120 and the diffusion lines 110 that are self-aligned to the wiring lines 120 which minimizes problems caused by misalignment of contacts and reduces processing costs compared to prior methods.

Figure 1B:
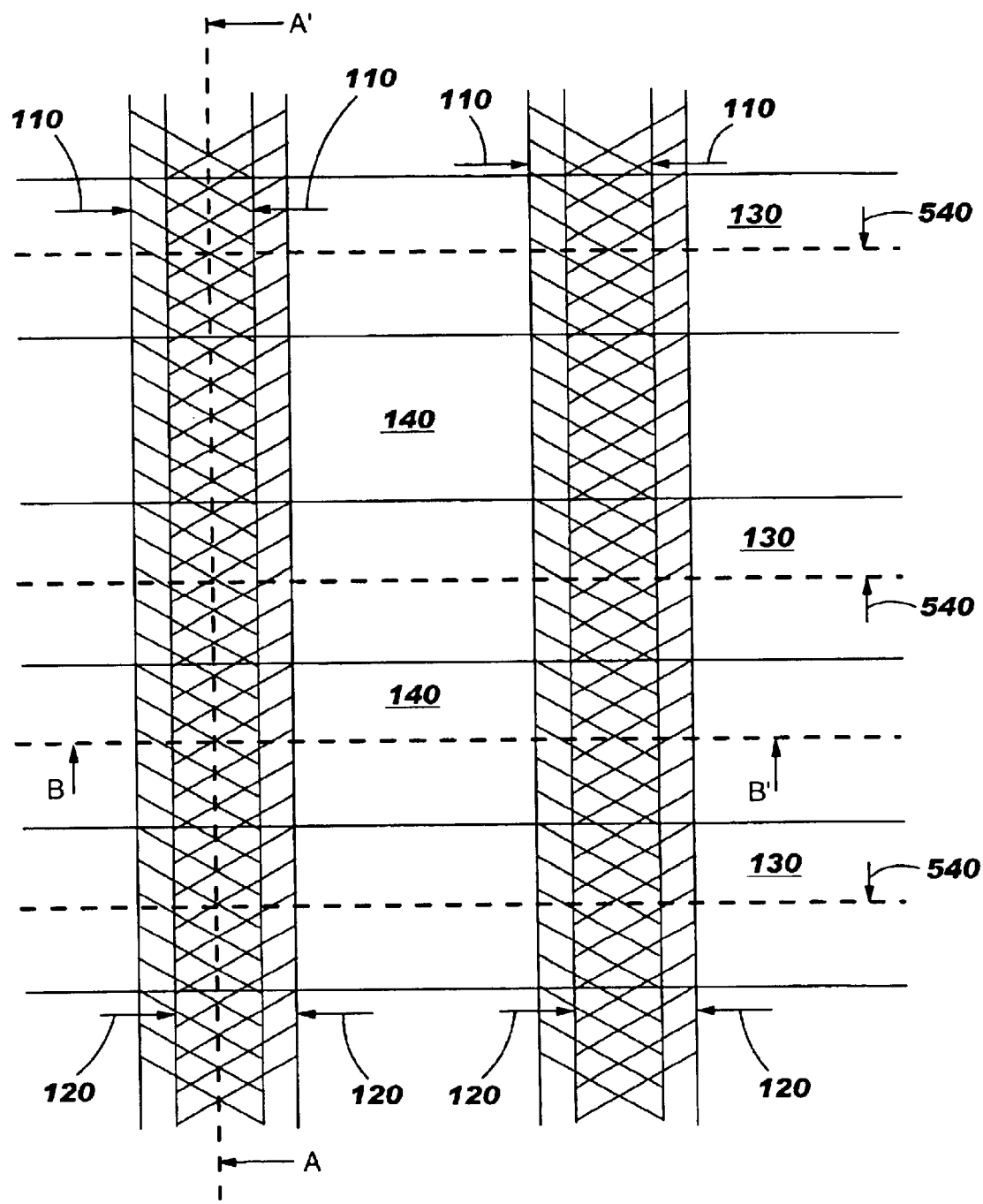
FIG. 1B illustrates a plan view of an array region layout, including a mask for a contact region.
Figure 2C:
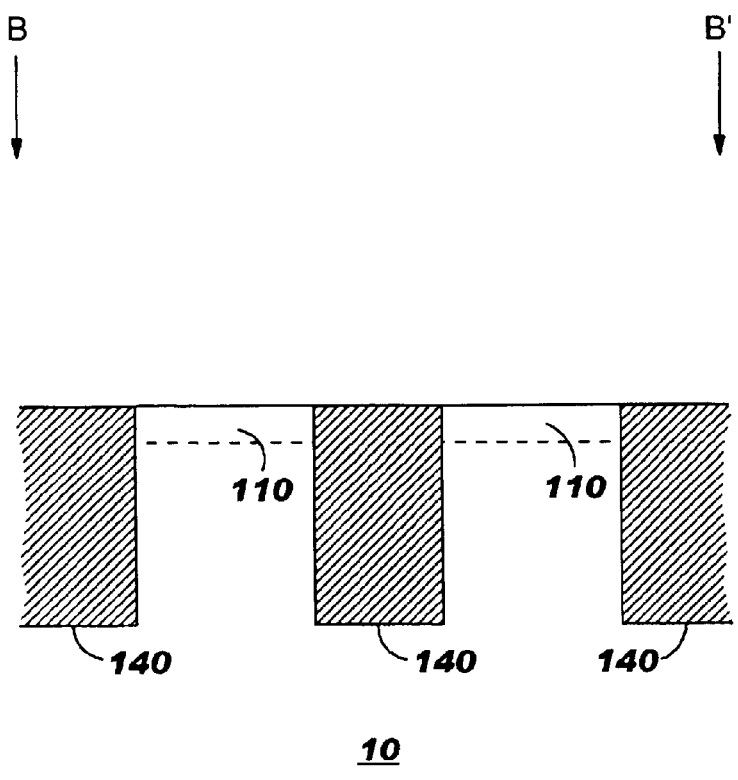

In accordance with the present invention, a substrate 10 is provided at an intermediate stage in which devices may be formed in both an array region 910 and a support region 920. FIG. 2A shows a cross-sectional view along the direction of line B–B' of FIGS. 1A and 1B extending through the array region 910 and support region 920. In the array region 910, doped portions of the substrate 10 form the diffusion regions 110. Isolation trenches 140 containing a dielectric material such as silicon oxide have been formed. A support device 230 is formed in the support region 920 having support device diffusion regions 111. Array devices (not shown), are formed in the array region having diffusion regions 110. The array devices, such as memory cells, are required to be densely packed. The memory cells may include planar or trench-type (vertical) devices. Word lines 130 are formed in a layout that intersects the layout of the diffusion regions 110, as shown in the cross-section in FIG. 2B along the line A–A' of FIG. 1A. The word lines 130 may be formed within a dielectric material 115, as illustrated in FIG. 2B, such as silicon nitride, which provides protection from shorts which may occur during the contact etch. In order to integrate the array devices into a circuit, contacts must be formed between the array device diffusion regions 110 and circuit wiring. FIG. 2C illustrates a cross-section of the structure of FIGS. 1A or 1B along the line B–B', wherein isolation trenches 140 separate diffusion regions 110. Corresponding cross-sections along the line A–A' are illustrated in FIGS. 3B, 4B, 5B, 6B and 7B, and along the line B–B' in FIGS. 3C, 4C, 5C, 6C and 7C, as described in more detail below.

Figure 3B:
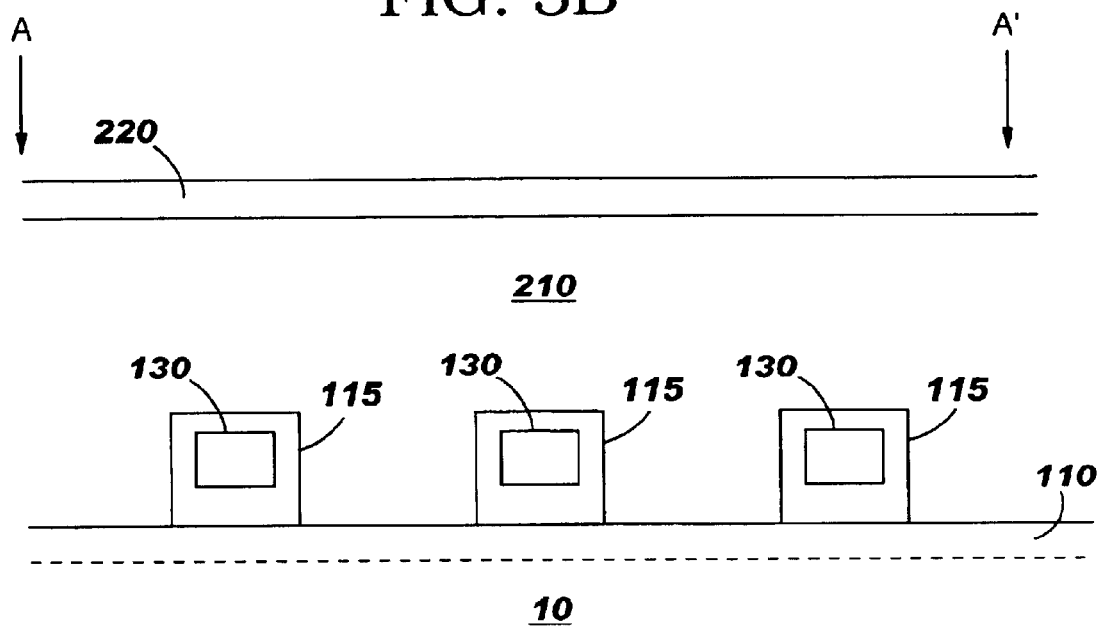
Figure 3C:
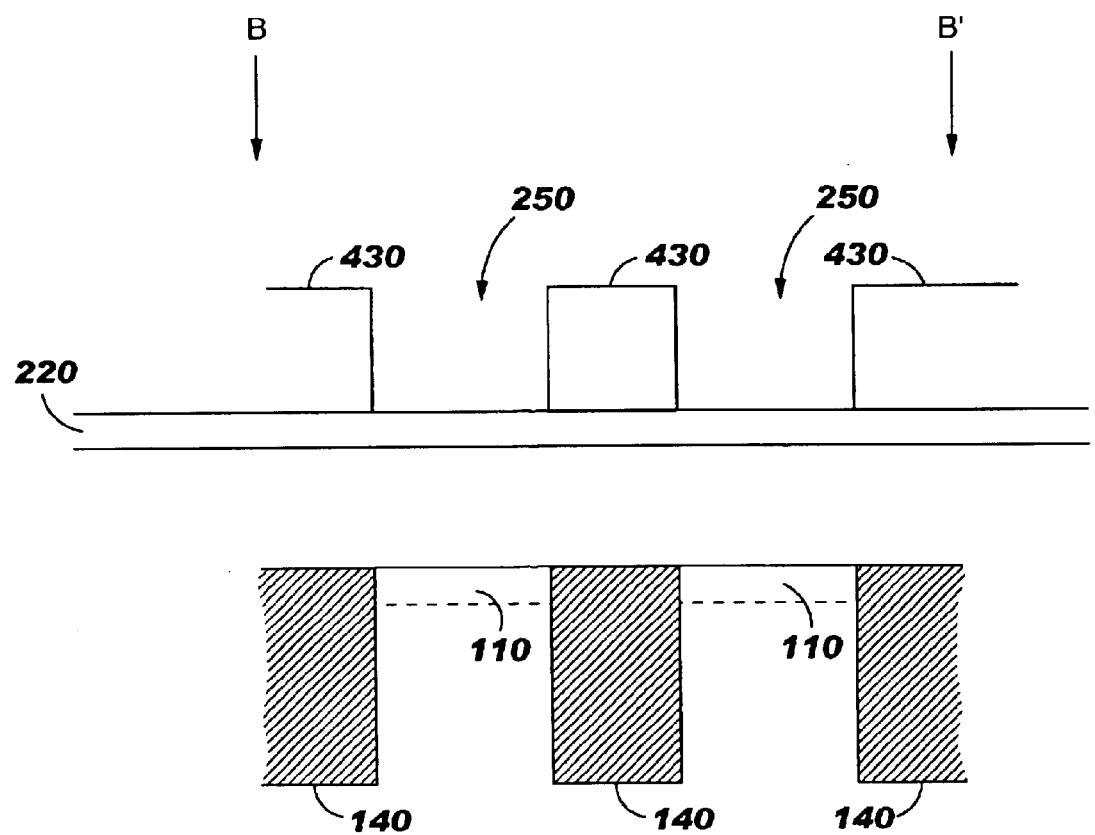

Referring to FIG. 3A, an interlevel dielectric layer 210 (ILD) is formed on the surface of the substrate 10. The ILD 210 may be formed from materials such as silicon oxide, borosilicate (BSG), phospho-silicate (PSG), and borophosphosilcate glass (BPSG), among others, and could include a combination of layers of such materials. The ILD layer 210 is preferably planarized, for example, by chemical mechanical polishing (CMP) or by applying the ILD using a spin-on technique. A hardmask layer 220 is formed on the surface of the ILD 210. The hardmask 220 may be formed from materials such as polysilicon, silicon nitride, silicon carbide or other materials that have high etch selectivity relative to the ILD etch. A resist layer 430 is formed on the hardmask layer 220 and is patterned to provide openings 250 for interconnects (wiring) in the array region and openings 270 for wiring in the support region. Note that, in this example, because of the high density of devices in the array region, which require features at or near the minimum feature size that the lithographic process can resolve, the interconnects in the array region are designed to have dimensions at or near the minimum feature size. However, the use of minimum feature size is not typically a requirement for wiring in the support regions. The openings 250 for interconnects in the array region are preferably aligned with the diffusion regions 110, but as a practical matter, some misalignment always occurs. Cross-sections along lines A–A' and B–B' at this stage of the process are illustrated in FIGS. 3B and 3C, respectively.

Figure 4B:
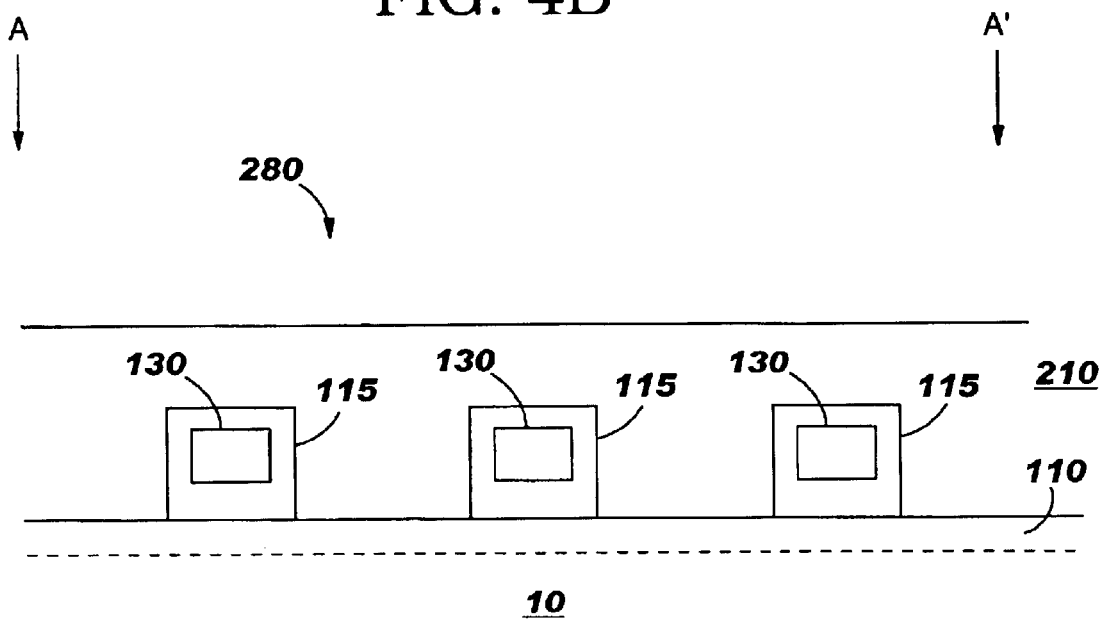
Figure 4C:
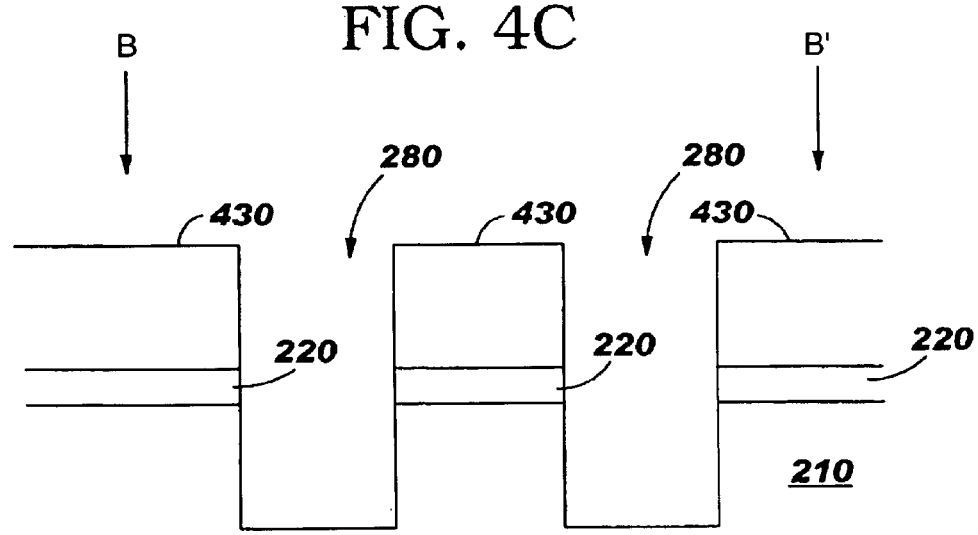
Figure 4C:
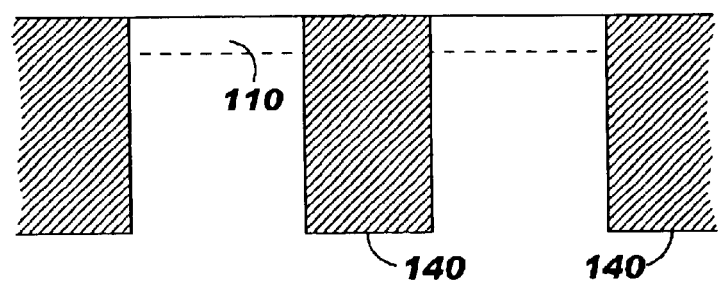

The hardmask 220 is then patterned according to the resist patterning. The patterned hardmask 220 is now used as the mask for subsequent etching of the dielectric layer 210. At this stage, the resist 430 may be optionally stripped off, or may be left on during the next etching step of the ILD layer 210, which may be preferable for cost effectiveness. The ILD layer 210 is then partially etched, selective to the resist 430 (and to the hardmask 220 if the resist 430 has been removed) to form the features 280 that will be used for wiring lines in both the array region 910 and in the support region 920, as illustrated in FIG. 4A. At this stage, the ILD layer 210 is partially etched to form openings 280 which define the interconnect (wiring) structures, so that array devices and wordlines 130 remain covered by the ILD layer 210 in the array region 910 as shown in the A–A' cross-section in FIG. 4B. The resulting cross-section along the B–B' line is shown in FIG. 4C.

Figure 5B:
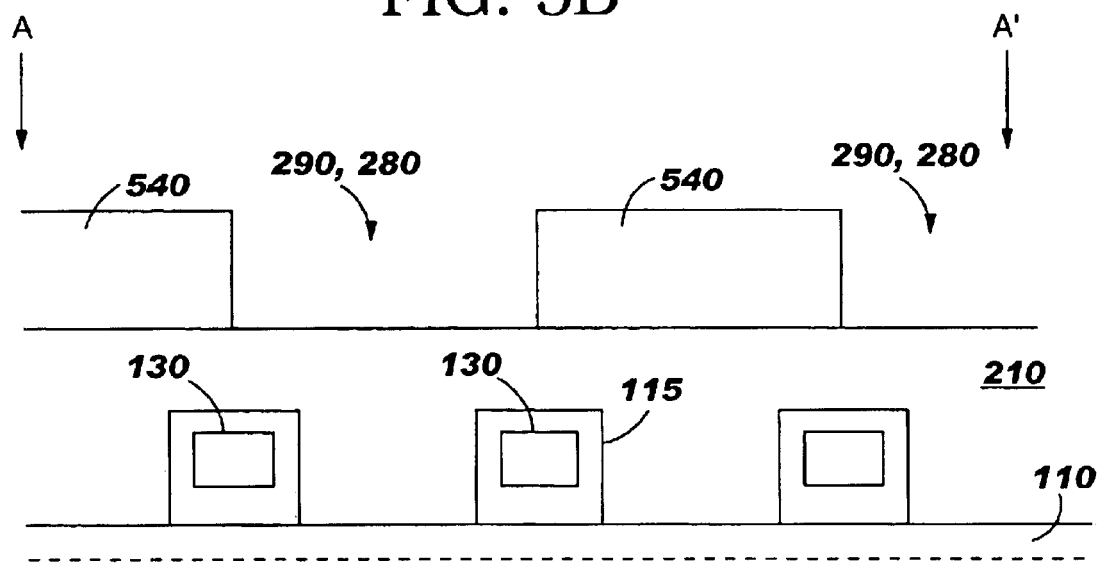
Figure 5C:
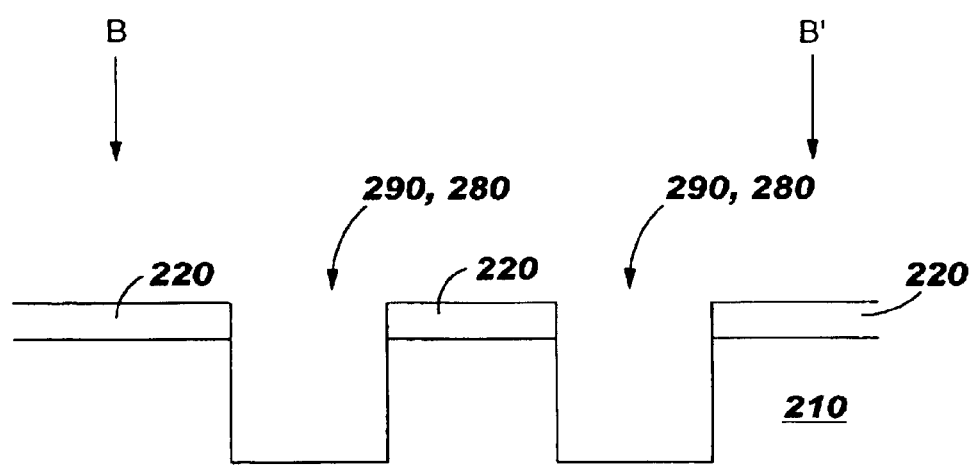
Figure 5C:
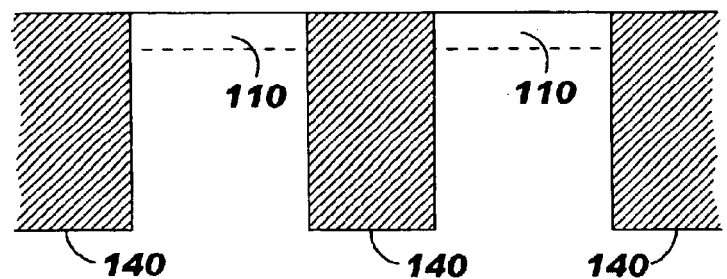
Figure 8A:
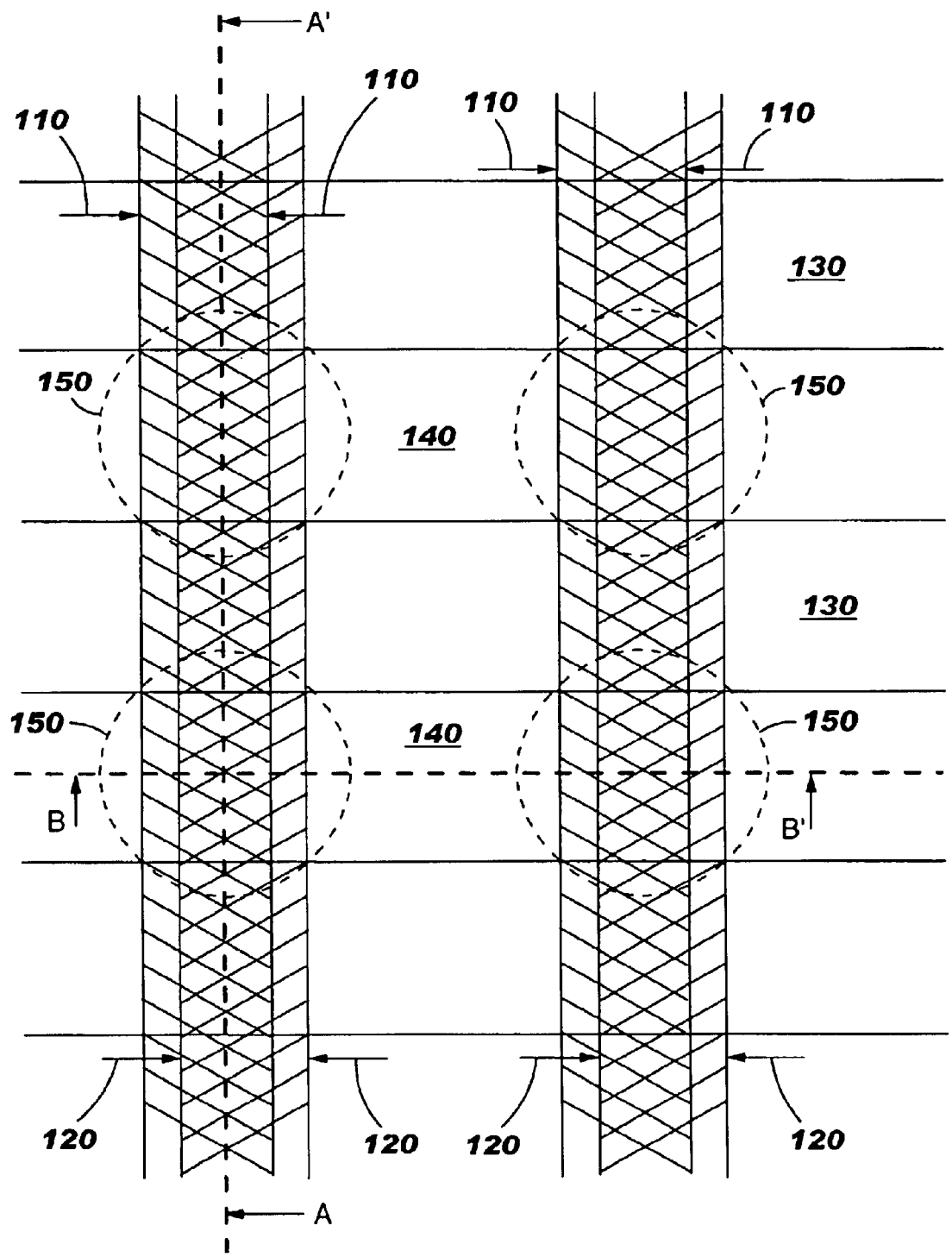
FIG. 8A illustrates a plan view of a prior art layout including contact via regions.
Figure 8B:
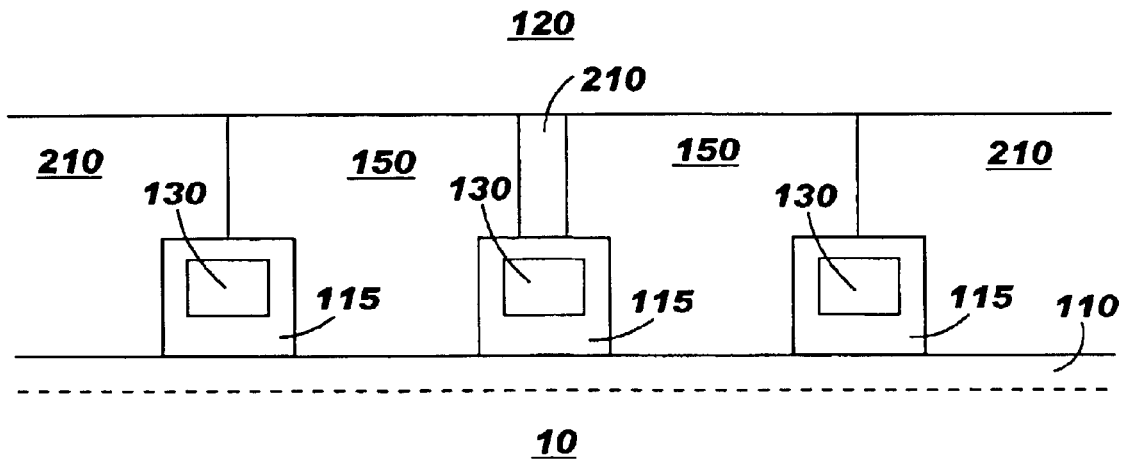
FIGS. 8B–8C illustrates cross-sectional views of the layout of FIG. 8A.
Figure 8C:
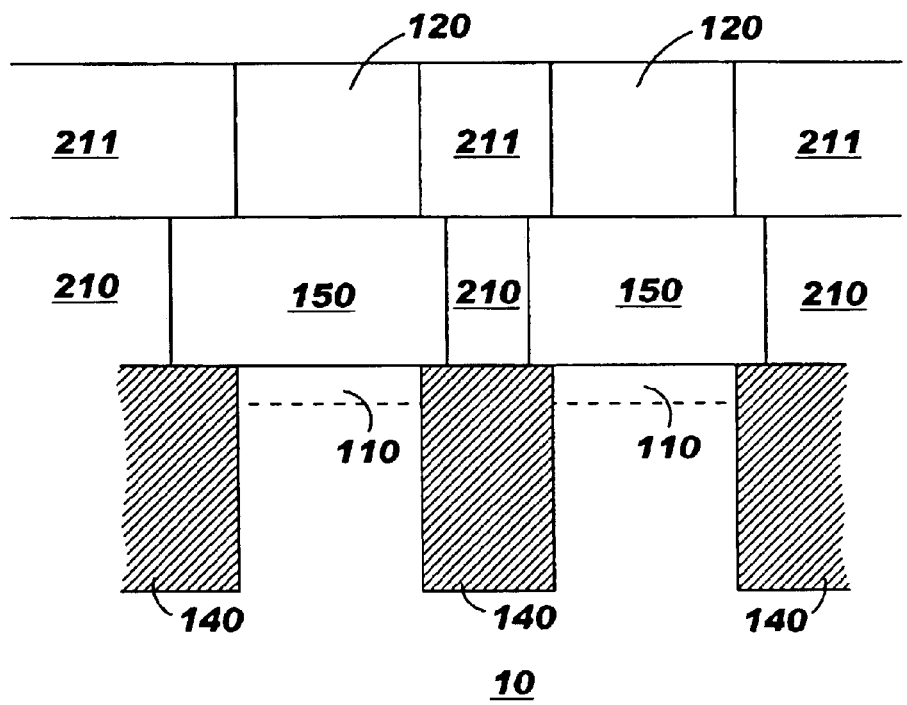
Figure 9A:
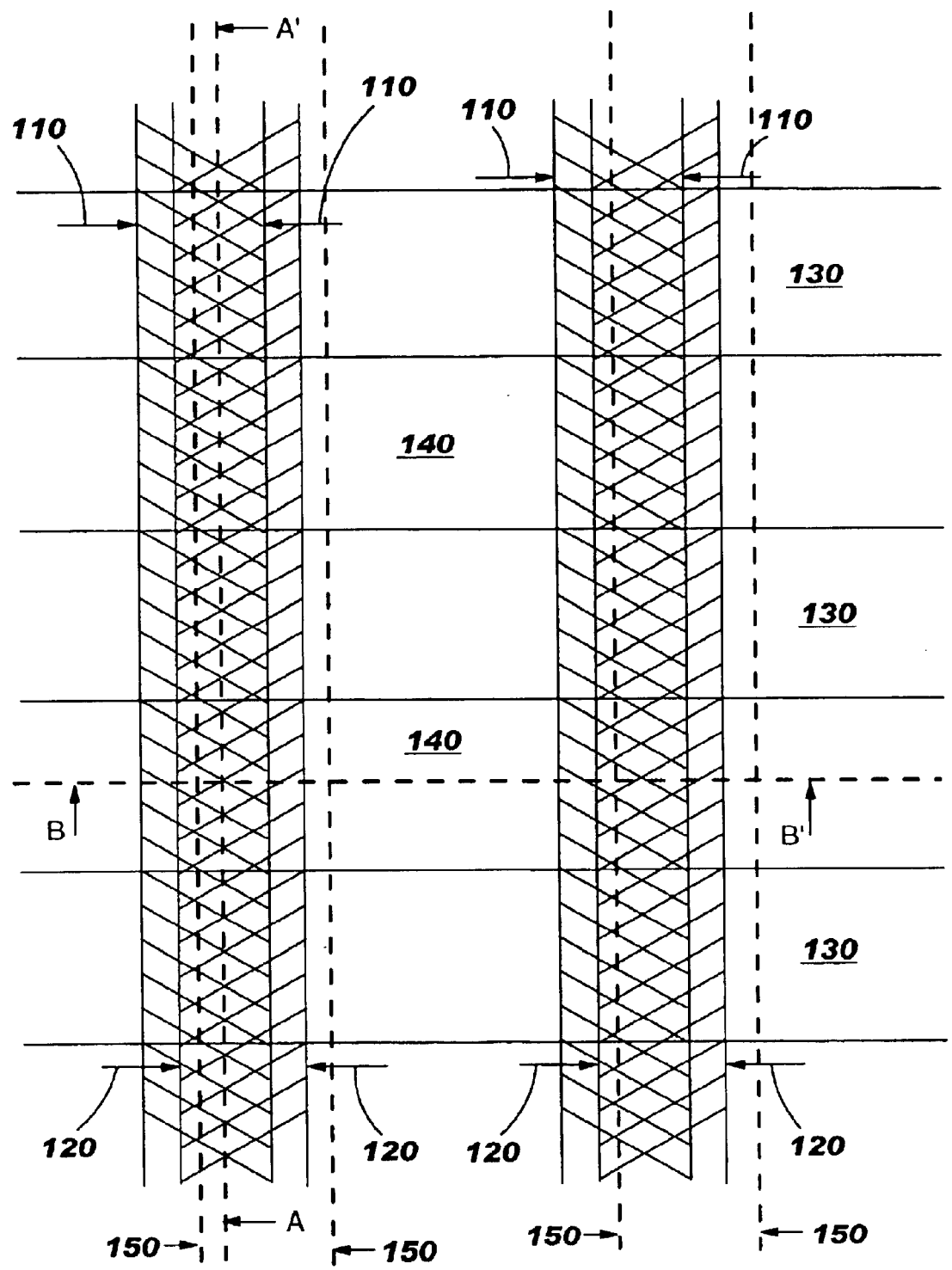
FIG. 9A illustrates a prior art plan view of a layout including line-type contact regions.

Next, the resist layer 430 is removed, if it has not already been removed, and a layer of resist is formed as a mask 540 over the support region 920, which could be a block mask as shown in FIG. 5A. The patterned hardmask 220 remains in place. In addition, the contact areas 150 are defined by patterning the resist 540 appropriately in the array area. The pattern used to define contact regions in the array area will be dependent on the array device layout, and type of devices used, which could be, for example, planar devices or trench devices. For example, contact via holes 150 could be defined as illustrated in FIG. 8A using the mask material 540 patterned to expose the contact vias 150. Alternatively, referring to FIG. 1B, contact regions could be defined by a line-type mask 540 as part of the mask 540 that blocks the support region, but which cross the openings in the patterned hardmask 220 to expose defined contact regions. Thus, line mask 540 would define the upper and lower boundaries of the contact regions, while the hardmask 220 will define the left and right boundaries of the contact regions. Such a line mask as in FIG. 1B may cross the wire line regions 120 and diffusion regions 110 at any appropriate angle, which is not necessarily at 90 degrees. A non-orthogonal angle may be preferable in cases when the underlying AA pattern is more complex than a simple alternating line and space pattern as depicted in the current example. In another possible embodiment of an array region layout, contact regions that are parallel to the wiring lines 120 and the diffusion regions 110 may be desired, and in such an embodiment, the patterned hardmask 220 alone will be sufficient to define the contact regions and no resist material 540 will be required to define the contacts in the array region 910, requiring only a block mask 540 in the support region 920. If the cross line-type mask 540 as illustrated in FIG. 1B is used, then the mask 540 will define contact openings 290 (which overlap interconnect openings 280) as shown in the cross-section along line A–A' as shown in FIG. 5B, and the hardmask 220 will define the contact openings 290/280 along the line B—B' as in the cross-section shown in FIG. 5C.

In some layouts, devices may have been formed that have gate stacks 130, 230 including gate conductors 130, 230 encapsulated in an insulator 115, 215 and have corresponding source/drain regions 110, 111, respectively. The encapsulating dielectric 115, 215 may be used as an aid in defining the boundaries of the contact openings 290 which result in contact structures 620 that are borderless to the encapsulated gate stacks (130/115, 230/215) and thus self-aligned to the source/drain regions 110, 111. This is performed by etching the ILD 210 selective to the encapsulating dielectric 115, 215, as is known in the art.

Figure 6B:
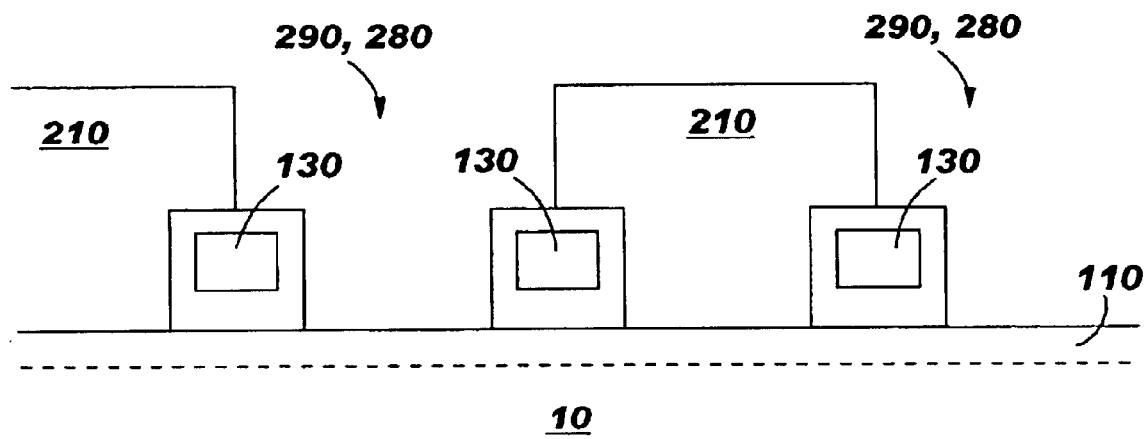
Figure 6C:
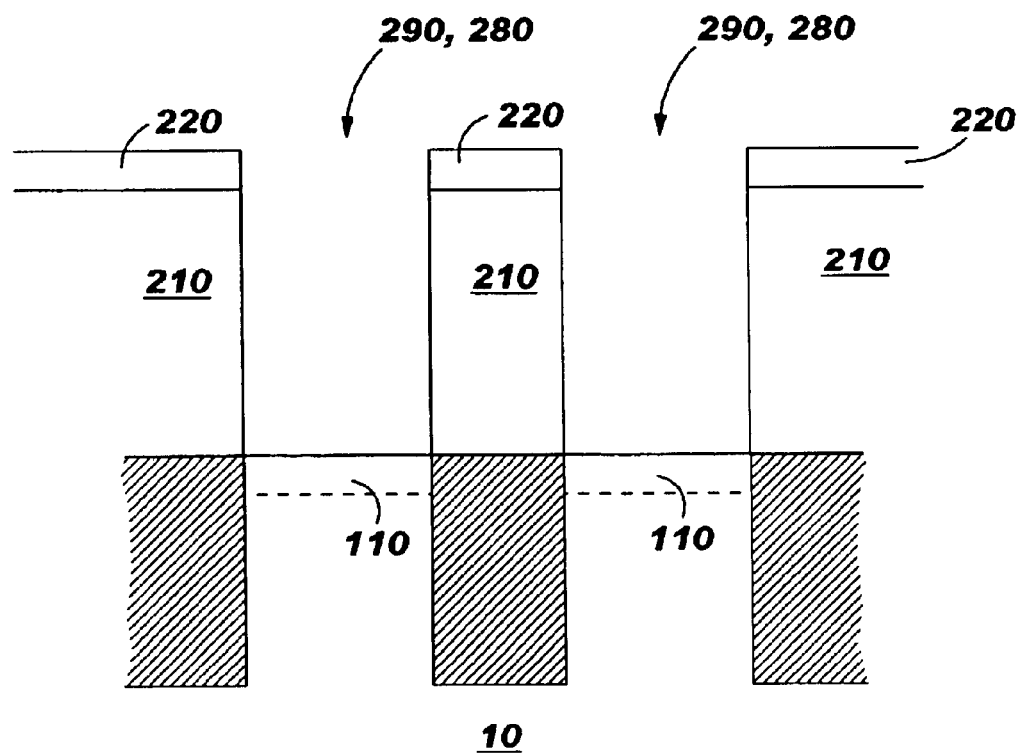

The ILD dielectric layer 210 is then etched selective to the hardmask 220 and mask 540, so that the diffusion region 110 is exposed within the contact openings 290. The etching is preferably an anisotropic etch, such as a reactive ion etch (RIE). The resulting structure is illustrated in FIGS. 6A, 6B and 6C.

Figure 7A:
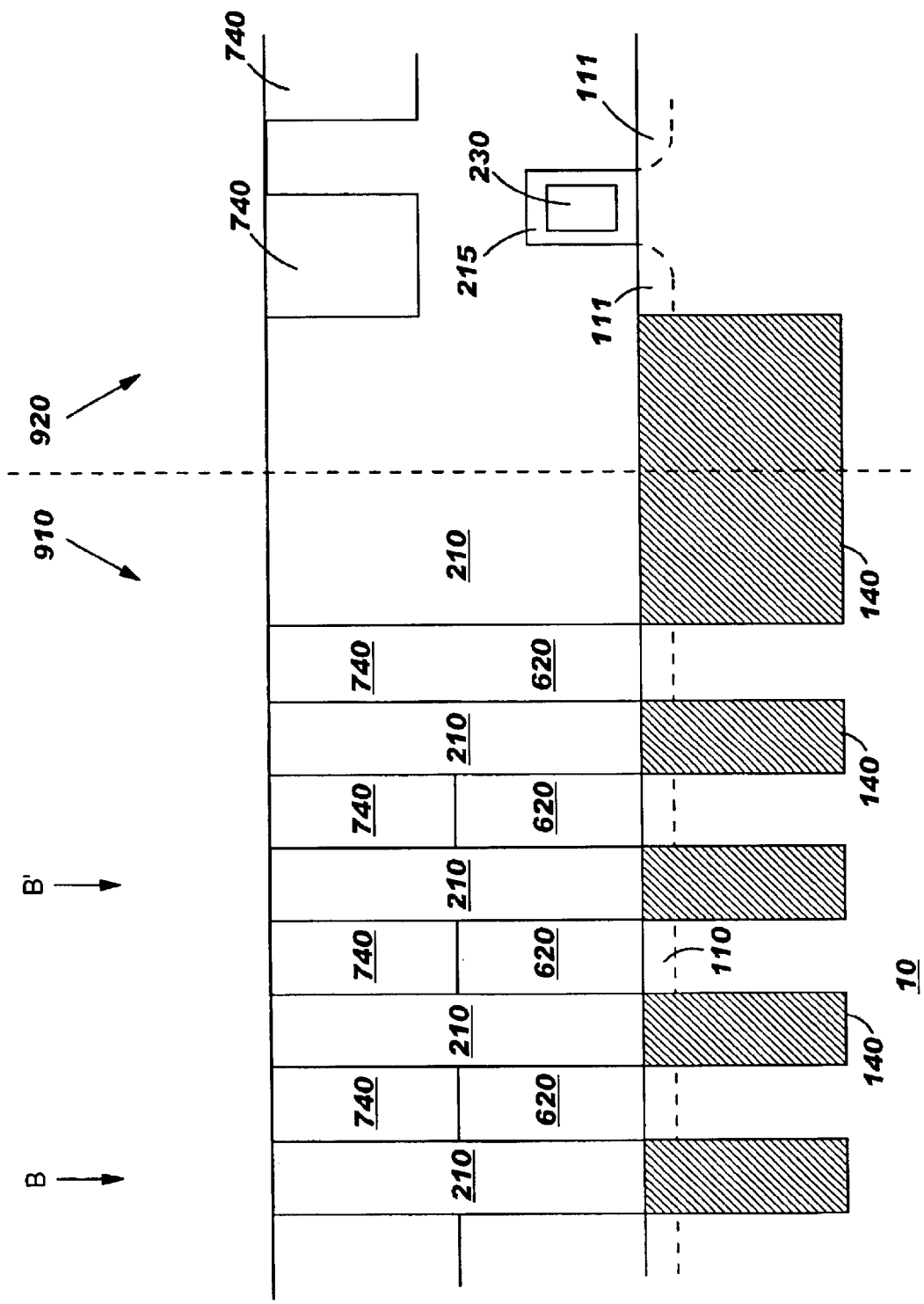
FIGS. 7A–7C illustrates cross-sectional views of a semiconductor substrate at a subsequent processing stage of one embodiment in accordance with the present invention.
Figure 7B:
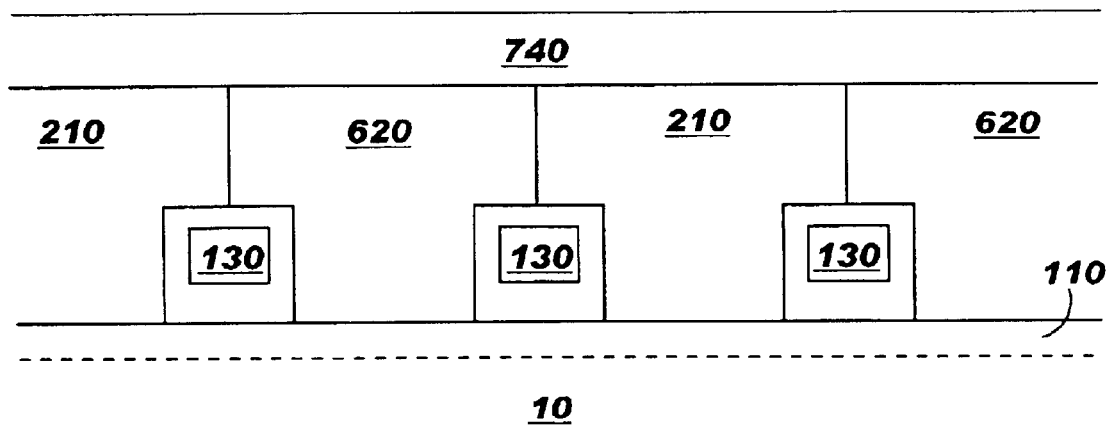
Figure 7C:
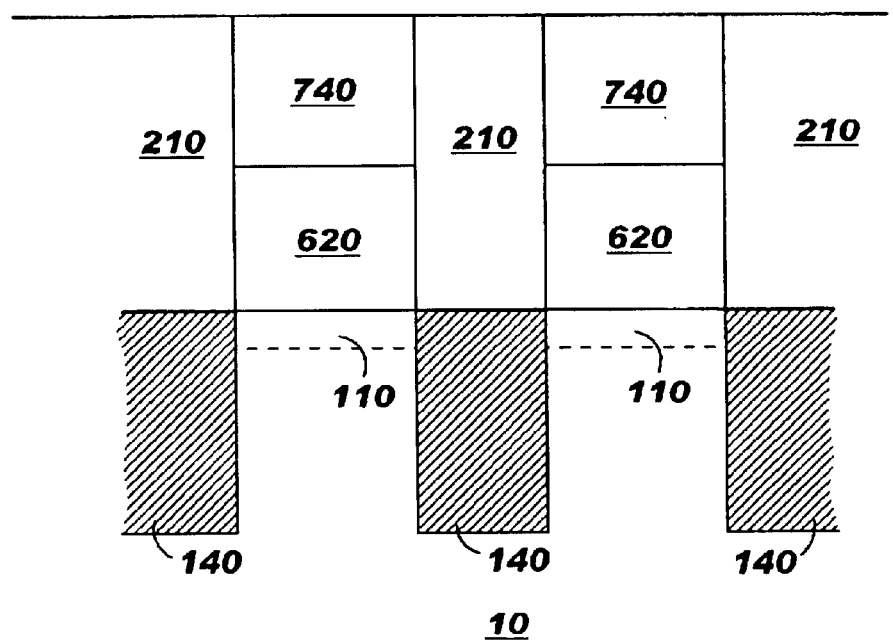

Subsequently, the mask 540 is removed. The wiring and contact openings may now be filled with conductive material 620, 740 using processes known in the art, resulting in the structure illustrated in FIG. 7A. For example, barrier layers (not shown) are typically formed in such openings to protect against undesirable interactions between the conductive material and adjacent materials. The conductive materials in the contact structure 620 and interconnect or wiring structure 740 could be the same or conductive materials, depending on the application, but are shown seperately here to illustrate that the contact structures 620 and the wiring (interconnect) structures 740 formed in accordance with the present invention are self-aligned Conductive materials for the contact structures 620 could include, for example, tungsten polysilicon, polysilicide or even stacked conductor combinations. Conductive materials for interconnect structures 740 may include tungsten, aluminum, or possibly copper. The hardmask layer 220 will be removed during this process, for example by planarization methods such as chemical-mechanical polishing (CMP) or an etchback method. Cross-sections of the reasulting structure along lines A–A' and B–B' are illustrated in FIGS. 7B and 7C, respectively.

The process in accordance with the present invention has, among other benefits, the formation of self-aligned contact and wiring structures, and also requires fewer process steps than conventional methods, thus reducing costs. The method of forming wiring and contact structures in accordance with the present invention is not restricted to the layouts illustrated in the embodiments discussed above, and are not restricted to any particular types of devices.

It will be appreciated by those skilled in the art that the method and layout in accordance with the present invention is not limited to the embodiments discussed above. Accordingly, the invention is intended to encompass all such alternatives, modifications and variations which fall within the scope and spirit of the invention and the following claims.

We claim:

1. A semiconductor device comprising:

a substrate including device diffusion region;

a dielectric layer on said substrate;

a contact structure formed in said dielectric layer; and an interconnect structure formed in said dielectric layer over said contact structure, so that said contact structure is in contact with said device diffusion region and said interconnect structure and wherein said contact structure and said interconnect structure are aligned with each other.

2. The semiconductor device of claim 1, wherein said contact structure comprises a first conductive material and said interconnect structure comprises a second conductive material.

3. The semiconductor device of claim 2, wherein said first conductive material and said second conductive material consist essentially of the same conductive material.

4. The semiconductor device of claim 1, wherein said substrate further comprises an array region including a vertical memory device comprising said device diffusion region.

5. The semiconductor device of claim 1, wherein said substrate further comprises a gate stack including an encapsulating material adjacent to said device diffusion region wherein said contact structure and said encapsulating material share a boundary.

6. The semiconductor device of claim 1, wherein said substrate further comprises an array region and a support region, said array region including an array device diffusion region and an array interconnect structure and said support region including a support device diffusion region and a support interconnect structure, and further comprising an array contact structure in contact with said array device diffusion region and said array interconnect structure and further comprising a support contact structure in contact with said support device diffusion region and said support interconnect structure, wherein said array contact structure is aligned with said array interconnect structure and said support contact structure is aligned with said support interconnect structure.

* * * * *